(12) United States Patent
Joo et al.

(10) Patent No.: US 9,490,443 B2
(45) Date of Patent: Nov. 8, 2016

(54) LIGHT EMITTING DISPLAY DEVICE AND METHOD FOR FABRICATING THE SAME

(71) Applicant: Samsung Display Co., Ltd., Yongin, Gyeonggi-Do (KR)

(72) Inventors: Sung Joong Joo, Yongin-si (KR); You Min Cha, Asan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/057,280

(22) Filed: Oct. 18, 2013

(65) Prior Publication Data

US 2014/0319478 A1  Oct. 30, 2014

(30) Foreign Application Priority Data

Dec. 21, 2012  (KR) .................. 10-2012-0150924

(51) Int. Cl.
| | | |
|---|---|---|
| H01L 29/08 | (2006.01) | |
| H01L 51/00 | (2006.01) | |
| H01L 51/50 | (2006.01) | |
| H01L 51/56 | (2006.01) | |
| H01L 27/32 | (2006.01) | |

(52) U.S. Cl.
CPC ....... *H01L 51/5036* (2013.01); *H01L 27/3283* (2013.01); *H01L 51/56* (2013.01); *H01L 27/3211* (2013.01); *H01L 2227/323* (2013.01)

(58) Field of Classification Search
CPC ..... H01L 51/536; H01L 27/31; H01L 51/56; H01L 27/32
USPC ............... 257/40, 88, E21.158, E51.018, 59; 438/35, 34
See application file for complete search history.

(56) References Cited

U.S. PATENT DOCUMENTS

| | | | |
|---|---|---|---|
| 6,810,919 B2 | 11/2004 | Seki et al. | |
| 8,106,410 B2 | 1/2012 | Sekiya | |
| 2005/0007322 A1* | 1/2005 | Adachi | ............... H01L 27/3244 345/82 |
| 2005/0221121 A1* | 10/2005 | Ishihara et al. | ............... 428/690 |
| 2006/0147650 A1* | 7/2006 | Park | ..................... H01L 27/1214 428/1.1 |
| 2008/0265785 A1* | 10/2008 | Kim | ........................... 315/169.3 |
| 2009/0002280 A1* | 1/2009 | Kim | ..................... G09G 3/3233 345/76 |

(Continued)

FOREIGN PATENT DOCUMENTS

| | | |
|---|---|---|
| JP | 2007-005324 A | 1/2007 |
| KR | 10-2005-0120725 A | 12/2005 |
| KR | 10-2010-0091104 A | 8/2010 |

*Primary Examiner* — Jessica Stultz
*Assistant Examiner* — Sheikh Maruf
(74) *Attorney, Agent, or Firm* — Robert E. Bushnell, Esq.

(57) ABSTRACT

A light emitting display device and a method for fabricating the same. The light emitting display device includes a substrate, a first electrode arranged on the substrate, a first insulating film arranged on the substrate and including a first opening that exposes a portion of the first electrode, a second insulating film arranged on the first insulating film and including a second opening that exposes the first opening, a light emitting layer including a light emitting material arranged on the exposed portion of first electrode while also being in contact with the first insulating film and a second electrode arranged on the light emitting layer, wherein a difference in wetting between the first electrode and the first insulating film with respect to the light emitting material is lower than a difference in wetting between the first electrode and the second insulating film with respect to the light emitting material.

15 Claims, 16 Drawing Sheets

(56) References Cited

U.S. PATENT DOCUMENTS

| | | | |
|---|---|---|---|
| 2009/0015145 A1* | 1/2009 | Park et al. ............... 313/504 | |
| 2009/0096949 A1* | 4/2009 | Cho ............. H01L 27/3262 349/43 | |
| 2009/0134392 A1* | 5/2009 | Jeong ............ H01L 27/1244 257/59 | |
| 2009/0278131 A1* | 11/2009 | Kwon ............ H01L 27/1255 257/72 | |
| 2010/0038689 A1* | 2/2010 | Ahn ............... H01L 21/84 257/292 | |
| 2010/0193790 A1* | 8/2010 | Yeo ............... H01L 27/3248 257/59 | |
| 2010/0264408 A1* | 10/2010 | Bale .............. H01L 51/0003 257/40 | |
| 2011/0031480 A1* | 2/2011 | Nakamura et al. ....... 257/40 | |
| 2011/0114956 A1* | 5/2011 | Park et al. .............. 257/59 | |
| 2011/0163339 A1* | 7/2011 | Negishi et al. ......... 257/98 | |
| 2012/0104367 A1* | 5/2012 | Hasegawa et al. ....... 257/40 | |
| 2012/0175649 A1* | 7/2012 | Hong ............ H01L 27/1255 257/89 | |
| 2012/0329190 A1* | 12/2012 | Kim et al. .............. 438/34 | |
| 2013/0187163 A1* | 7/2013 | Kim et al. .............. 257/59 | |
| 2013/0299816 A1* | 11/2013 | Bessho et al. ........... 257/40 | |
| 2013/0328020 A1* | 12/2013 | Lee ............... H01L 51/56 257/40 | |

* cited by examiner

LIGHT EMITTING DISPLAY DEVICE AND METHOD FOR FABRICATING THE SAME

CLAIM OF PRIORITY

This application makes reference to, incorporates the same herein, and claims all benefits accruing under 35 U.S.C. §119 from an application earlier filed in the Korean Intellectual Property Office filed on 21 Dec. 2012 and there duly assigned Serial No. 10-2012-0150924.

BACKGROUND OF THE INVENTION

1. Field of the Invention

The present invention relates to a light emitting display device and a method for fabricating the same.

2. Description of the Related Art

Typically, a flat display device may be classified into a light emitting type and a light receiving type. A light emitting type display device may be a flat cathode ray tube, a plasma display panel, an electroluminescence device, or a light emitting diode. A light receiving type display device may be a liquid crystal display. Among them, an electroluminescence device has the advantages of wide viewing angle, superior contrast, and high response speed, and has been noticed as the next-generation display device. Such an electroluminescence device is classified into an inorganic light emitting device and an organic light emitting device depending on the material that forms a light emitting layer.

An organic light emitting device has a light emitting layer that is made out of an organic material disposed between an anode electrode and a cathode electrode. If anode voltage and cathode voltage are applied to these electrodes, respectively, holes injected from the anode electrode move to the light emitting layer through a hole injection layer and a hole transport layer, and electrons move to the light emitting layer through an electron injection layer and an electron transport layer. In the light emitting layer, the electrons and the holes are recombined. Through this recombination, exitons are generated, and as the exitons are changed from an excited state to a ground state, the light emitting layer emits light to display an image.

Such an organic light emitting device includes a pixel-defining film having an opening for exposing the anode electrode, and the light emitting layer is formed on the anode electrode that is exposed through the opening of the pixel-defining film.

SUMMARY OF THE INVENTION

On the other hand, the light emitting layer may be formed by printing a light emitting material on the anode electrode exposed through the opening of the pixel-defining film by an ink jet printing technique.

However, due to the difference in material between the anode electrode and the pixel-defining film, wetting of the anode electrode with respect to the light emitting material in the opening of the pixel-defining film is different from wetting of the pixel-defining film. Accordingly, the light emitting layer may be formed on a region of the anode electrode in the opening of the pixel-defining film and on a region of the pixel-defining film with a non-uniform thickness.

Further, when the light emitting material is printed on the anode electrode that is exposed through the opening of the pixel-defining film by the ink jet printing technique, the light emitting material may get out of the opening in the pixel-defining film.

Accordingly, in the case of printing the light emitting material on the anode electrode that is exposed through the opening of the pixel-defining film by the ink jet printing technique, it is difficult to form the light emitting layer on the inside of the opening of the pixel-defining film with a uniform thickness and to accurately position the light emitting layer on the inside of the opening.

Accordingly, one subject to be solved by the present invention is to provide a light emitting display device which can achieve uniform light emission through an accurate positioning of the light emitting layer in a desired space with a uniform thickness.

Another subject to be solved by the present invention is to provide a method for fabricating a light emitting display device which can achieve uniform light emission through an accurate positioning of the light emitting layer in a desired space with a uniform thickness.

Additional advantages, subjects, and features of the invention will be set forth in part in the description which follows and in part will become apparent to those having ordinary skill in the art upon examination of the following or may be learned from practice of the invention.

According to one aspect of the present invention, there is provided a light emitting display device that includes a substrate, a first electrode arranged on the substrate, a first insulating film arranged on the substrate and including a first opening that exposes a portion of the first electrode, a second insulating film arranged on the first insulating film and including a second opening that exposes the first opening, a light emitting layer including a light emitting material arranged on the portion of first electrode that is exposed by the first opening while also being in contact with the first insulating film and a second electrode arranged on the light emitting layer, wherein a difference in wetting between the first electrode and the first insulating film with respect to the light emitting material may be lower than a difference in wetting between the first electrode and the second insulating film with respect to the light emitting material.

The wetting of the first insulating film with respect to the light emitting material may be substantially the same as the wetting of the first electrode with respect to the light emitting material. The contact angles of the first electrode and the first insulating film with respect to the light emitting material may be equal to or lower than 10°, and a contact angle of the second insulating film with respect to the light emitting material may be equal to or greater than 50°. The first electrode may include ITO (Indium Tin Oxide), and the first insulating film may include one or more of silicon oxide, silicon nitride and silicon oxynitride. The first insulating film may include a material selected from a group consisting of silicon oxide, silicon nitride, and silicon oxynitride, and the second insulating film may include a material selected from a group consisting of benzo cyclo butene (BCB), polyimide (PI), polyamide (PA), acrylic resin and phenol resin. The light emitting layer may include one or more of an inorganic material including Se, inorganic material including Zn, a low-molecular organic material and a high-molecular organic material. The second insulating film may include a photosensitive material.

The substrate may include a plurality of pixels, and the first insulating film may be a pixel-defining film that defines each of the plurality of pixels. The plurality of pixels may include a red pixel region, a green pixel region, and a blue pixel region, the light emitting layer may include a red organic light emitting layer arranged within the red pixel region, a green organic light emitting layer arranged within the green pixel region and a blue organic light emitting layer arranged within the blue pixel region. The light emitting layer may include a white organic layer. The white organic layer may include a red organic layer, a green organic layer, and a blue organic layer. The white organic layer may instead include a yellow organic layer and a blue organic layer.

According to another aspect of the present invention, there is provided a method of fabricating a light emitting display device, that includes forming a first electrode on a substrate, forming first and second insulating films on the substrate, the first insulating film may have a first opening that exposes a portion of the first electrode and the second insulating film may have a second opening that corresponds to the first opening, forming a light emitting layer that includes a light emitting material on the exposed portion of the first electrode while contacting the first insulating and forming a second electrode on the light emitting layer, a difference in wetting between the first electrode and the first insulating film with respect to the light emitting material may be lower than a difference in wetting between the first electrode and the second insulating film with respect to the light emitting material.

The forming of the first and second insulating films may include depositing a first insulating material on an entire surface of the substrate to cover the first electrode, depositing a second insulating material on an entire surface of the first insulating material, arranging a mask on an upper portion of the second insulating material, the mask may have an opening that corresponds to a portion of the first electrode, exposing the second insulating material with light, forming the second insulating film having the second opening by developing the second insulating material by using a developer and forming the first insulating film having the first opening by etching the first insulating material using the second insulating film as an etch mask.

The forming of the first and second insulating films may instead include depositing a first insulating material on an entire surface of the substrate to cover the first electrode, depositing a photoresist film on an entire surface of the first mask having a first opening that corresponds to a portion of the first electrode, exposing the photoresist film by using light, forming a photoresist pattern by developing the photoresist film by using a develop, forming the first insulating film having the first opening by etching the first insulating material using the photoresist pattern as an etch mask, removing the photoresist pattern, depositing a second insulating material that includes a photosensitive material on the first insulating film and on the portion the first electrode exposed by the etching of the first insulating material, arranging a second mask on an upper portion of the second insulating material, the second mask having a second opening that corresponds to the first opening, exposing the second insulating material using light and forming the second insulating film having the second opening by developing the second insulating material by using the developer.

The forming the light emitting layer may include printing the light emitting material on the exposed portion of the first electrode by an ink jet printing technique. The forming the first electrode may include arranging the first electrode in each of a red pixel region, a green pixel region, and a blue pixel region on the substrate. The forming of the light emitting layer may include forming a red organic light emitting layer in the red pixel region, forming a green organic light emitting layer in the green pixel region and forming a blue organic light emitting layer in the blue pixel region. The forming of the light emitting layer may include forming a white organic light emitting layer in each of the red, green and blue pixel regions.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Hereinafter, embodiments of the present invention will be described with reference to the accompanying drawings.

Figure 1:
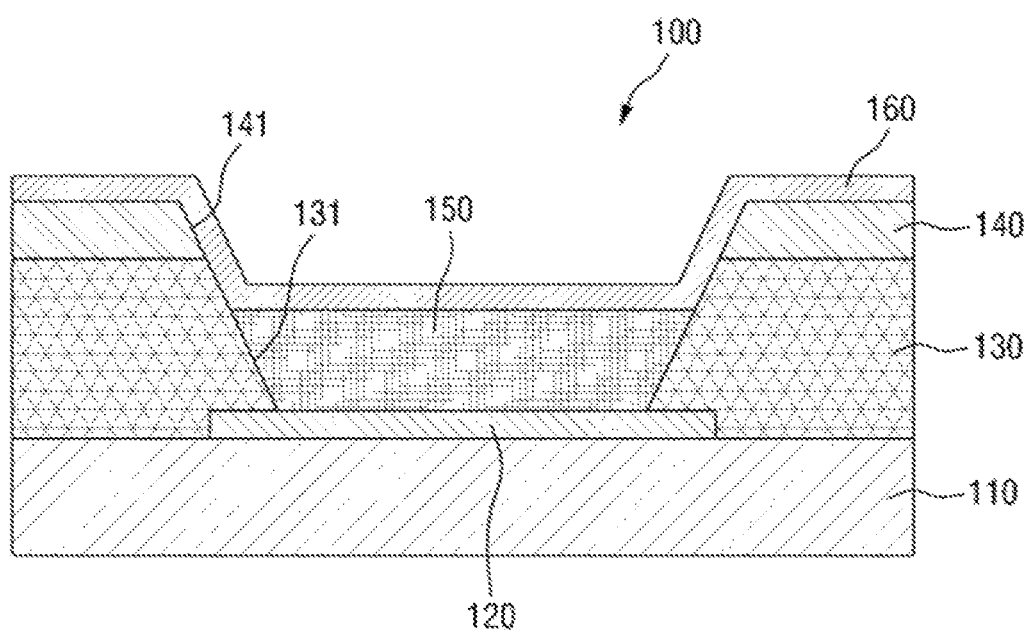
FIG. 1 is a cross-sectional view of a light emitting display device according to a first embodiment of the present invention.
Figure 2:
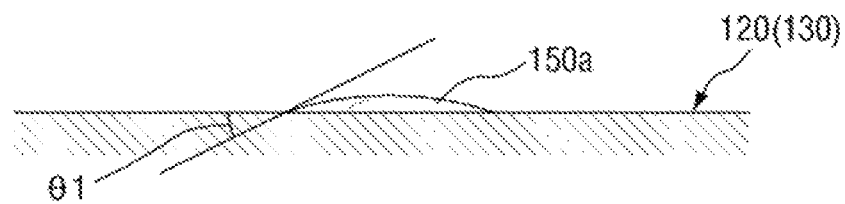
FIG. 2 is a cross-sectional view explaining a contact angle between a light emitting material of a light emitting layer and a first electrode and a contact angle between a light emitting material of a light emitting layer and a first insulating film illustrated in FIG. 1.
Figure 3:
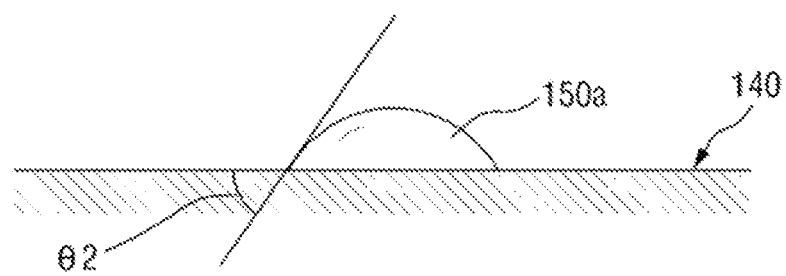
FIG. 3 is a cross-sectional view explaining a contact angle between a light emitting material of a light emitting layer and a second insulating film.

Turning now to FIGS. 1-3, FIG. 1 is a cross-sectional view of a light emitting display device according to a first embodiment of the present invention, FIG. 2 is a cross-sectional view explaining a contact angle between a light emitting material of a light emitting layer and a first electrode and a contact angle between a light emitting material of a light emitting layer and a first insulating film illustrated in FIG. 1, and FIG. 3 is a cross-sectional view explaining a contact angle between a light emitting material of a light emitting layer and a second insulating film.

Referring now to FIG. 1, a light emitting display device 100 according to an embodiment of the present invention includes a substrate 110, a first electrode 120, a first insulating film 130, a second insulating film 140, a light emitting layer 150, and a second electrode 160.

The substrate 110 may include an insulating substrate. The insulating substrate may be made out of a transparent glass material having $SiO_2$ as a main component. In some embodiments, the insulating substrate may be made out of an opaque material or a plastic material. Further, the insulating substrate may be a flexible substrate.

Although not illustrated, the substrate 110 may further include other structures formed on the insulating substrate. Examples of other structures may be a wiring, an electrode, an insulating film, and the like. In some embodiments, the substrate 110 may include a plurality of thin film transistors formed on the insulating substrate. A drain electrode of at least a part of the plurality of thin film transistors may be electrically connected to a first electrode 120. The thin film transistor may include an active region that is made of amorphous silicon, polycrystalline silicon, or monocrystalline silicon. In other embodiments, the thin film transistor may include an active region made out of an oxide semiconductor.

The first electrode 120 is formed on the substrate 110. The first electrode 120 may be an anode electrode which receives a signal that is applied to the drain electrode of the thin film transistor and provides holes to the light emitting layer 150 or a cathode electrode which receives the signal and provides electrons to the light emitting layer 150. The first electrode 120 may be used as a transparent electrode or a reflection electrode. In the case where the first electrode 120 is used as the transparent electrode, it may be made out of ITO (Indium Tin Oxide), IZO (ITO Zinc Oxide), ZnO (Zink Oxide), or $In_2O_3$. In the case where the first electrode 120 is used as the reflection electrode, it may be formed by forming a reflection film with Ag, Mg, Al, Pt, Pd, Au, Ni, Nd, Ir, Cr, or compounds thereof and then forming ITO, IZO, ZnO, or $In_2O_3$ thereon.

The first insulating film 130 is formed on the first electrode 120 to define a space for exposing the first electrode 120. That is, the first insulating film 130 is formed on the first electrode 120 to provide a first opening 131 for exposing the first electrode 120. Accordingly, the first insulating film 130 allows the light emitting layer 150 to be formed on the first electrode 120 through the first opening 131.

The second insulating film 140 is formed on the first insulating film 130 to provide a second opening 132 for exposing the first opening 131. The second insulating film 140 allows the light emitting layer 150 to be formed on the first electrode 120 through the second opening 132 for exposing the first opening 131.

The first insulating film 130 and the second insulating film 140 are made out of insulating materials. The first insulating film 130 and the second insulating film 140 are made out of different insulating materials, respectively, so that the difference in wetting between the first electrode 120 and the first insulting film 130 with respect to the light emitting material 150a becomes lower than the difference in wetting between the second insulating film 140 and the first electrode 120 with respect to the light emitting material 150a when a light emitting material 150a of the light emitting layer 150 is printed on the first electrode 120 by an ink jet printing technique. That is, the first insulating film 130 is made out of an insulating material having wetting, which is substantially the same as or similar to the wetting of the first electrode 120 with respect to the light emitting material 150a, but is substantially different from the wetting of the second insulating film 140.

This is because, if the wetting of the first insulating film is substantially the same as or similar to the wetting of the first electrode 120 with respect to the light emitting material 150a, the light emitting layer 150 can be formed with a uniform thickness on not only the first electrode 120 but also the first insulating film 130 when the light emitting layer 150 is formed by printing the light emitting material 150a on the first electrode 120 that is exposed through the first opening 131 of the first insulating film 130 by the ink jet printing technique. If the light emitting layer 150 is formed with a uniform thickness on the inside of the first opening 131 of the first insulating film 130, uniform light emission through the light emitting layer 150 can be performed, and thus the display quality of the light emitting display device 100 can be improved. Further, if the wetting of the first insulating film 130 is different from the wetting of the second insulating film 140 with respect to the light emitting material 150a, the light emitting material 150a is prevented from getting out of the first opening 131 of the first insulating film 130 when the light emitting material 150a is printed on the first electrode 120 that is exposed through the first opening 131 of the first insulting film 130 by the ink jet printing technique. Here, the second insulating film 140 may serve as a barrier to contain the light emitting material 150a of the light emitting layer 150 within the desired space and prevents the light emitting material 150a of the light emitting layer 150 from getting out to an undesired region.

The wettings of the first electrode 120, the first insulating film 130, and the second insulating film 140 with respect to the light emitting material 150a may be represented by contact angles against the light emitting material 150a. The contact angle is an angle when liquid is in thermodynamic equilibrium on a solid surface.

As illustrated in FIG. 2, the contact angle θ1 of the first electrode 120 and the first insulating film 130 with respect to the light emitting material 150a may be equal to or lower than 10°. For example, in the case where the first electrode 120 is made out of ITO, the first insulating film 130 may be made out of silicon oxide, silicon nitride, or silicon oxynitride. Here, since the contact angle θ1 of the first electrode 120 and the first insulating film 130 with respect to the light emitting material 150a is equal to or lower than 10°, the wettings of the first electrode 120 and the first insulating film 130 with respect to the light emitting material 150a are superior. The superior wetting means a small contact angle, so that the liquid widely spreads on the solid surface, so that a degree which the liquid is in contact with a solid surface is high.

As illustrated in FIG. 3, the contact angle θ2 of the second insulating film 140 with respect to the light emitting material 150a may be equal to or higher than 50°. For example, in the case where the first insulating film 130 is made out of silicon oxide, silicon nitride, or silicon oxynitride, the second insulating film 140 may be made out of at least one of benzo cyclo butene (BCB), polyimide (PI), polyamide (PA), acrylic resin, and phenol resin. Here, since the contact angle θ2 of the second insulating film 140 with respect to the light emitting material 150a is equal to or higher than 50°, the wetting of the second insulating film 140 with respect to the light emitting material 150a is low. The structure having low wetting can serve as a barrier.

In some embodiments, the second insulating film 140 may be formed to include a photosensitive material. In this case, the second insulating film 140 may serve as a mask film when the first insulating film 130 having the first opening 131 is formed by a photolithography process. Accordingly, the second insulating film 140 does not separately require a photoresist film, and thus a process of fabricating the light emitting display device 100 can be simplified. On the other hand, in the case where the second insulating film 140 does not include the photosensitive material, the first insulating film 130 having the first opening 131 is formed using a separate mask.

The light emitting layer 150 is formed on the first electrode 120 that is exposed by the first opening 131 of the first insulating film 130, and comes in contact with the first insulating film 130 in the first opening 131 of the first insulating film 130. The light emitting layer 150 emits light through recombination of holes provided from the first electrode 120 and electrons provided from the second electrode 150. More specifically, if the holes and the electrons are provided to the light emitting layer 150, they are recombined to form exitons, and the light emitting layer 150 emits light as the exitons are shifted from an excited state to a ground state. The light emitting layer 150 may be made out of an inorganic material including Se or Zn, or a low-molecular or high-molecular organic material.

The second electrode 160 is formed on the light emitting layer 150, and may be a cathode electrode that provides electrons to the light emitting layer 150 or an anode electrode that provides holes to the light emitting layer 150. In the same manner as the first electrode 120, the second electrode 160 may be used as a transparent electrode or a reflection electrode.

Although not illustrated, the light emitting display device 100 may further include a sealing substrate that is arranged on an upper portion of the second electrode 160. The sealing substrate may be an insulating substrate. A spacer may be disposed between the second electrode 160 on the second insulating film 140 and the sealing substrate. In some embodiments of the present invention, the sealing substrate may be omitted. In this case, a sealing film that is made out of an insulating material may cover the whole structure to protect the structure.

As described above, the light emitting display device 100 includes the first insulating film 130 and the second insulating film 140, which are made out of different insulating materials, respectively, so that the difference in wetting between the first electrode 120 and the first insulting film 130 with respect to the light emitting material 150a becomes lower than the difference in wetting between the second insulating film 140 and the first electrode 120 with respect to the light emitting material 150a.

According to the light emitting display device 100 of the first embodiment of the present invention, when the light emitting layer 150 is formed by printing the light emitting material 150a on the first electrode 120 that is exposed through the first opening 131 of the first insulating film 130 by the ink jet printing technique, the light emitting material 150a is prevented from escaping from the first opening 131 of the first insulating film 130, and the light emitting layer 150 is formed to have a uniform thickness on not only the first electrode 120 but also the first insulating film 130.

Accordingly, since the light emitting layer 150 can be accurately positioned within the desired space and can be formed to have the uniform thickness, uniform light emission through the light emitting layer 150 can be achieved, and thus the display quality of the light emitting display device 100 can be improved.

Next, a method for fabricating a light emitting display device 100 according to a first embodiment of the present invention will be described.

Turning now to FIGS. 4 to 13, FIG. 4 is a flowchart of a method for fabricating a light emitting display device according to the embodiments of the present invention, and FIGS. 5 to 13 are cross-sectional views explaining a first method for fabricating a light emitting display device according to an embodiment of the present invention.

Figure 4:
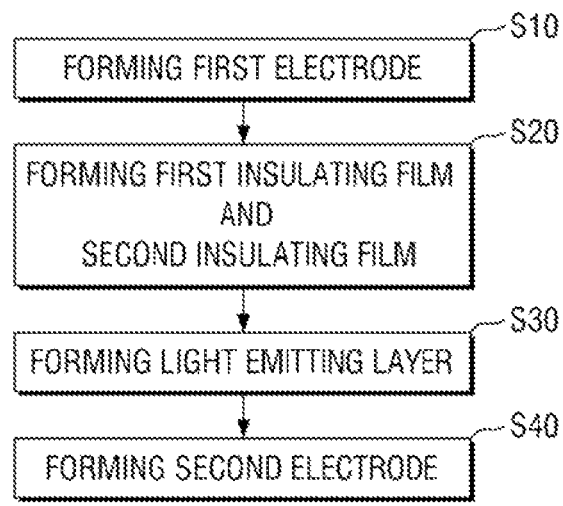
FIG. 4 is a flowchart of a method for fabricating a light emitting display device according to the embodiments of the present invention.

Referring to FIG. 4, the method for fabricating the light emitting display device 100 according to an embodiment of the present invention includes a first electrode forming step S10, a first and second insulating film forming step S20, a light emitting layer forming step S30, and a second electrode forming step S40.

Figure 5:
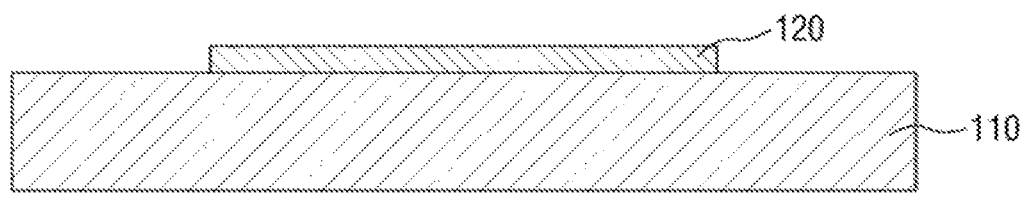
FIG. 5 shows the first electrode being formed on the substrate according to a first embodiment of the present invention.

Referring to FIG. 5, the first electrode forming step S10 is a step of forming the first electrode 120 on the substrate 110. Specifically, in the first electrode forming step S10, a transparent electrode material or a reflecting material is deposited on the substrate 110 on which thin film transistors are formed, and the first electrode 120 is formed thereon through patterning.

Referring to FIGS. 6 to 10, in the first and second insulating film forming step S20, the first insulating film 130 having the first opening 131 is formed on the substrate 110 to define a space for exposing the first electrode 120, and the second insulating film 140 having the second opening 141 for exposing the first opening 131 is formed on the first insulating film 130.

Figure 6:
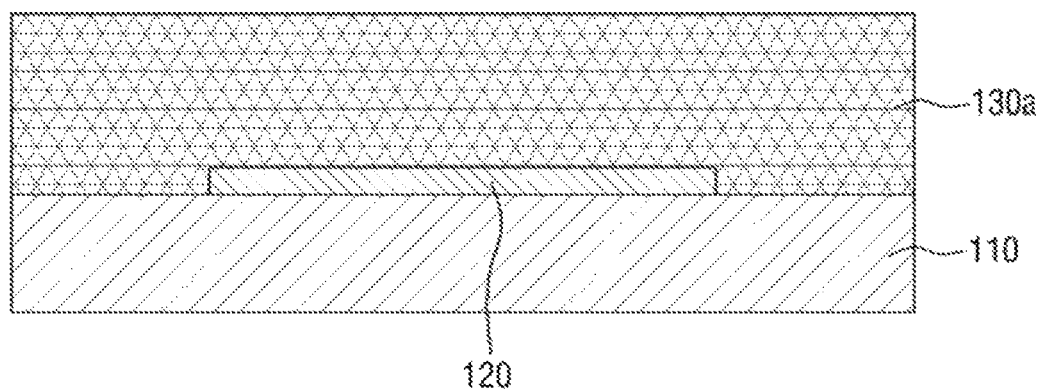
FIG. 6 shows the first insulating material being formed on the structure of FIG. 5 according to a first embodiment of the present invention.

First, in the first and second insulating film forming step S20, as illustrated in FIG. 6, a first insulating material 130a is deposited on the entire surface of the substrate 110 to cover the first electrode 120 by a deposition technique. The first insulating material 130a is a material to form the first insulating film 130, and is the same as the insulating material of the first insulating film 130 as described above.

Figure 7:
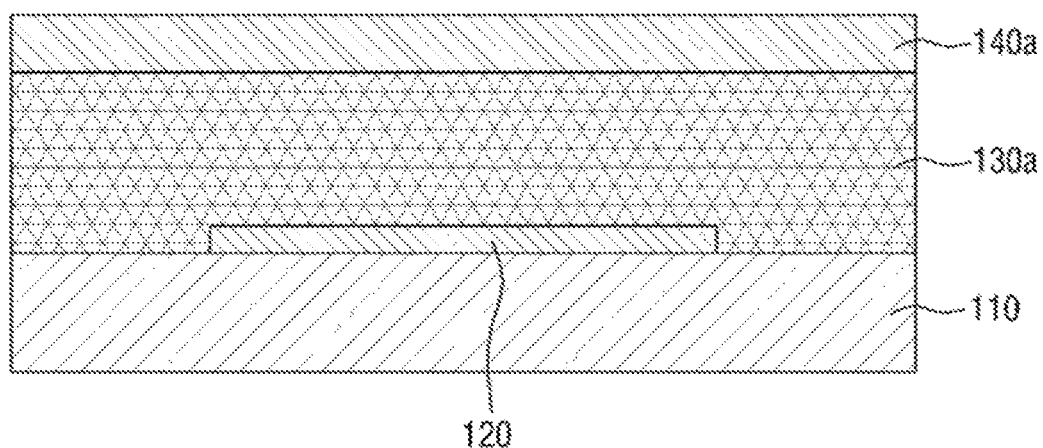
FIG. 7 shows the second insulating material that includes a photosensitive material being formed on the structure of FIG. 6 according to a first embodiment of the present invention.

Further, in the first and second insulating film forming step S20, as illustrated in FIG. 7, a second insulating material 140a is deposited on the entire surface of the first insulating material 130a by the deposition technique. The second insulating material 140a is a material to form the second insulating film 140, and is the same as the insulating material of the second insulating film 140, and may include a photosensitive material.

Figure 8:
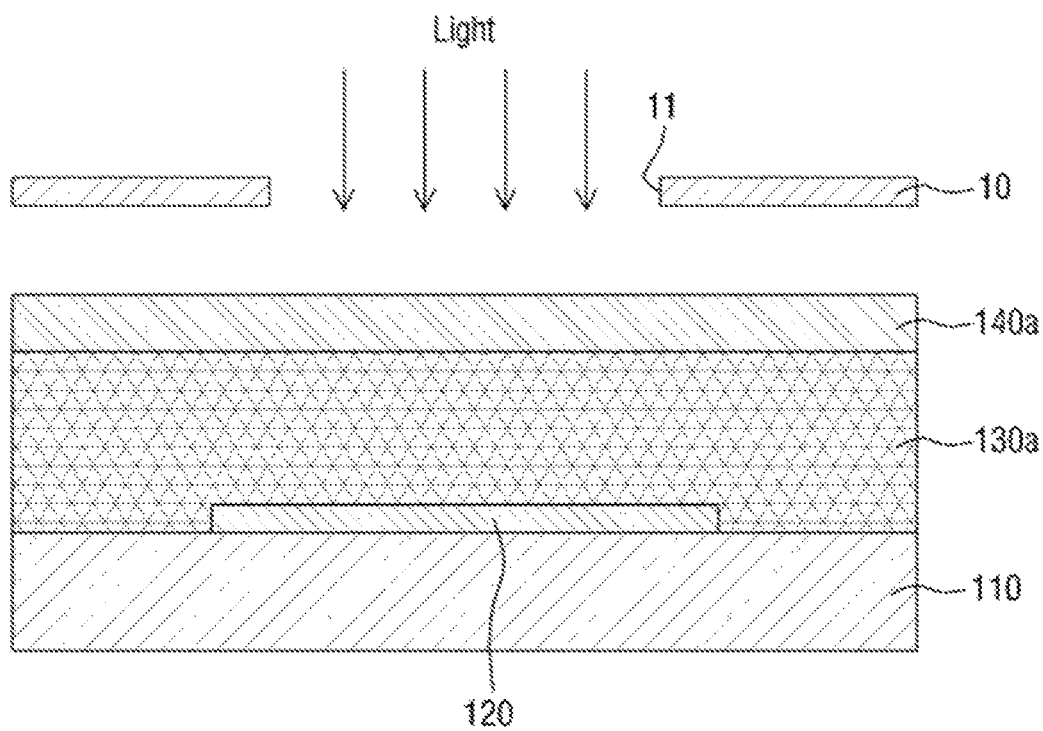
FIG. 8 illustrates an exposure process where a mask is used to pattern the second insulating material according to a first embodiment of the present invention.
Figure 9:
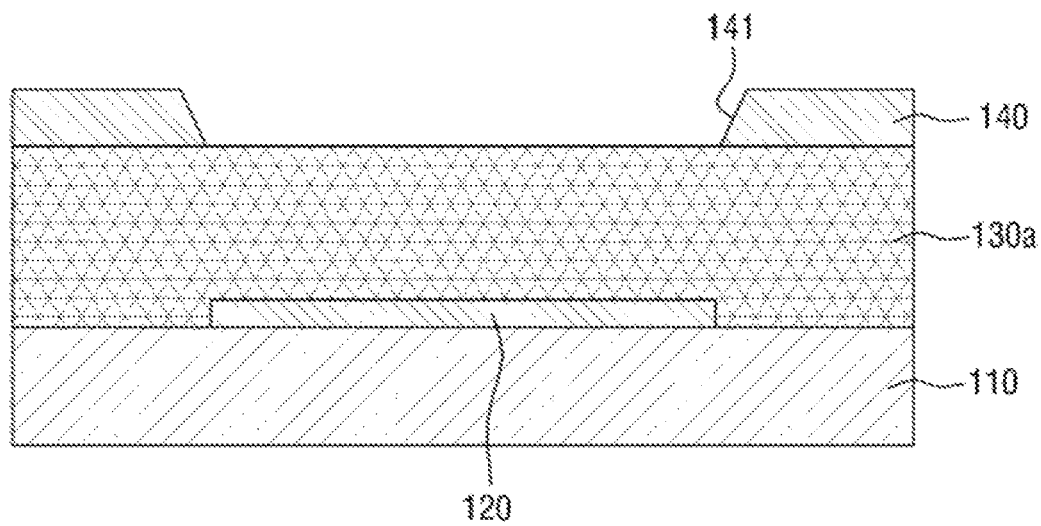
FIG. 9 illustrates a the second insulating film after being patterned by a development process according to a first embodiment of the present invention.

Further, in the first and second insulating film forming step S20, as illustrated in FIG. 8, a mask 10 having an opening 11 is arranged on an upper portion of the second insulating material 140a in a state where the opening 11 corresponds to a location of the first electrode 120, and the second insulating material 140a is exposed using light and is developed using a developer. As a result, as illustrated in FIG. 9, the second insulating film 140 having a second opening 141 that is arranged at a location that corresponds to the first electrode 120 is formed.

Figure 10:
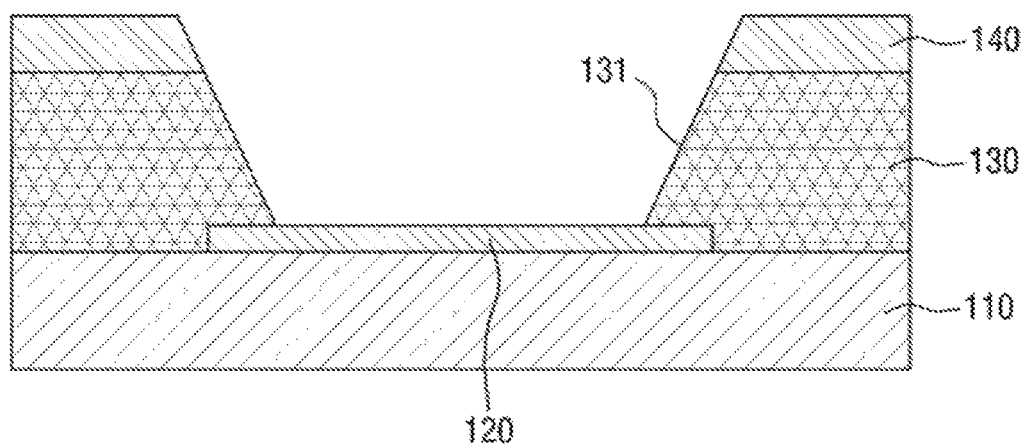
FIG. 10 illustrates a patterned first insulating film where the second insulating film serves as an etch mask according to a first embodiment of the present invention.

Further, in the first and second insulating film forming step S20, as illustrated in FIG. 10, the first insulating material 130a is etched using the second insulating film 140 as an etch mask, and as a result, the first insulating film 130 having the first opening 131 that is arranged at a location that corresponds to the first electrode 120 is formed.

Figure 11:
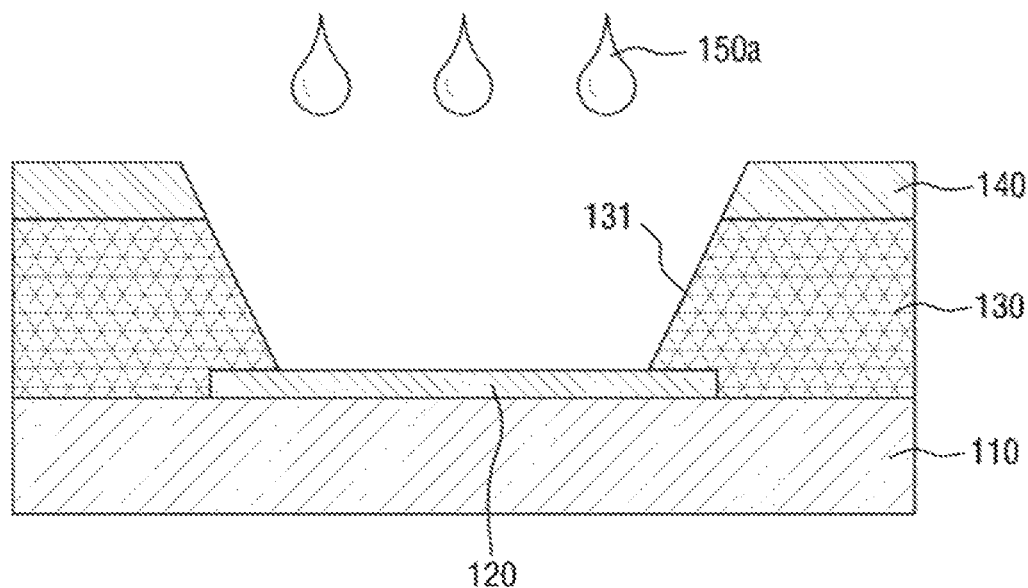
FIG. 11 application of a light emitting material onto the exposed portion of the first electrode by an ink jet printing technique according to a first embodiment of the present invention.
Figure 12:
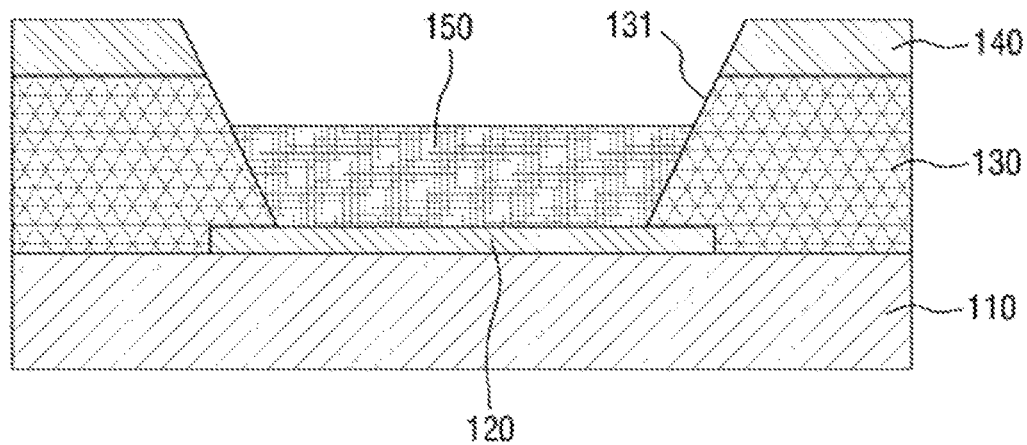
FIG. 12 illustrates the light emitting layer completely formed according to a first embodiment of the present invention.

Referring now to FIGS. 11 and 12, the light emitting layer forming step S30 is a step of forming the light emitting layer 150 on the first electrode 120 that is exposed through the first opening 131. Specifically, in the light emitting layer forming step S30, as illustrated in FIG. 11, the light emitting material 150a is discharged onto the first electrode 120 that is exposed through the first opening 131 by the ink jet printing technique. As a result, as illustrated in FIG. 12, the light emitting layer 150 is formed.

Figure 13:
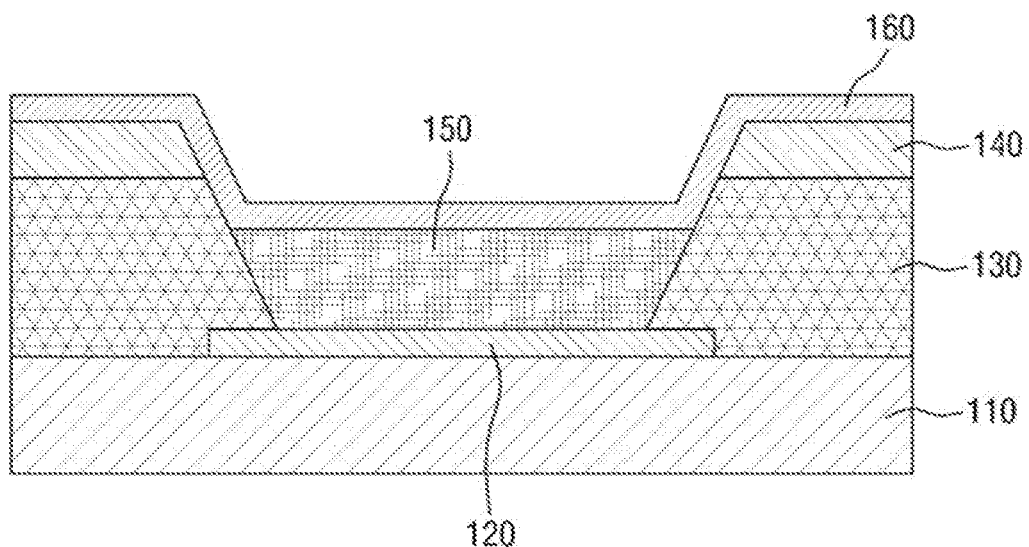
FIG. 13 illustrates formation of the second electrode on top of the light emitting layer according to a first embodiment of the present invention.

Referring now to FIG. 13, the second electrode forming step S40 is a step of forming the second electrode 160 by depositing a transparent electrode material or a reflecting material onto the light emitting layer 150 by a deposition technique.

Although not illustrated, the method for fabricating the light emitting display device 100 according to the first embodiment of the present invention may further include a step of arranging a sealing substrate on an upper portion of the second electrode 160. Further, the method for fabricating the light emitting display device 100 according to an embodiment of the present invention may further include a step of arranging a spacer between the second electrode 160 and the sealing substrate.

Next, second method for fabricating the light emitting display device 100 according to an embodiment of the present invention will be described. The second method for fabricating the light emitting display device 100 according to an embodiment of the present invention includes the steps as shown in the flowchart of FIG. 4. However, according to the second method for fabricating the light emitting display device 100 according to an embodiment of the present invention, only the first and second insulating film forming step S20 is different from that according to the first embodiment of the present invention. Accordingly, only the first and second insulating film forming step S20 according to the second method for fabricating the light emitting display device 100 according to an embodiment of the present invention will be described hereinafter, but the duplicate description of the first electrode forming step S10, the light emitting layer forming step S30, and the second electrode forming step S40 will be omitted.

Referring now to FIGS. 14-20, according to the second method, in the first and second insulating film forming step S20, the first insulating material 130a is patterned to produce first opening 131 prior to the deposition of the second insulating material 140a, thereby requiring two masks to perform the process. Consequently, the first opening 131 as well as the portion of the first electrode 120 are exposed upon forming the second opening 141 in the second insulating material 140a.

Figure 14:
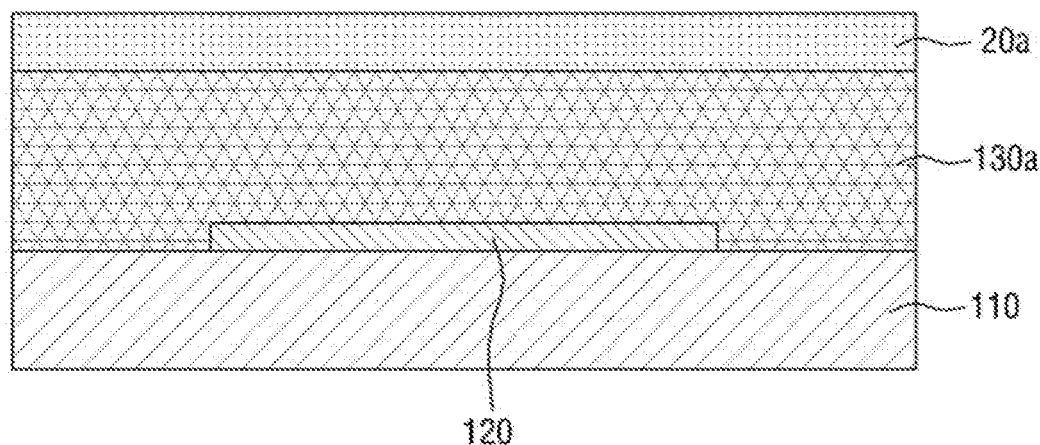
FIG. 14 illustrates application of a photoresist film onto a first insulating film according to a second embodiment of the present invention.

First, in the first and second insulating film forming step S20, as illustrated in FIG. 14, a first insulating material 130a is deposited on the entire surface of the substrate 110 to cover the first electrode 120 by a deposition technique. The first insulating material 130a is a material to form the first insulating film 130, and is the same as the insulating material of the first insulating film 130 as described above. Further, in the first and second insulating film forming step S20, a photoresist film 20a is deposited on the entire surface of the first insulating material 130a by the deposition technique.

Figure 15:
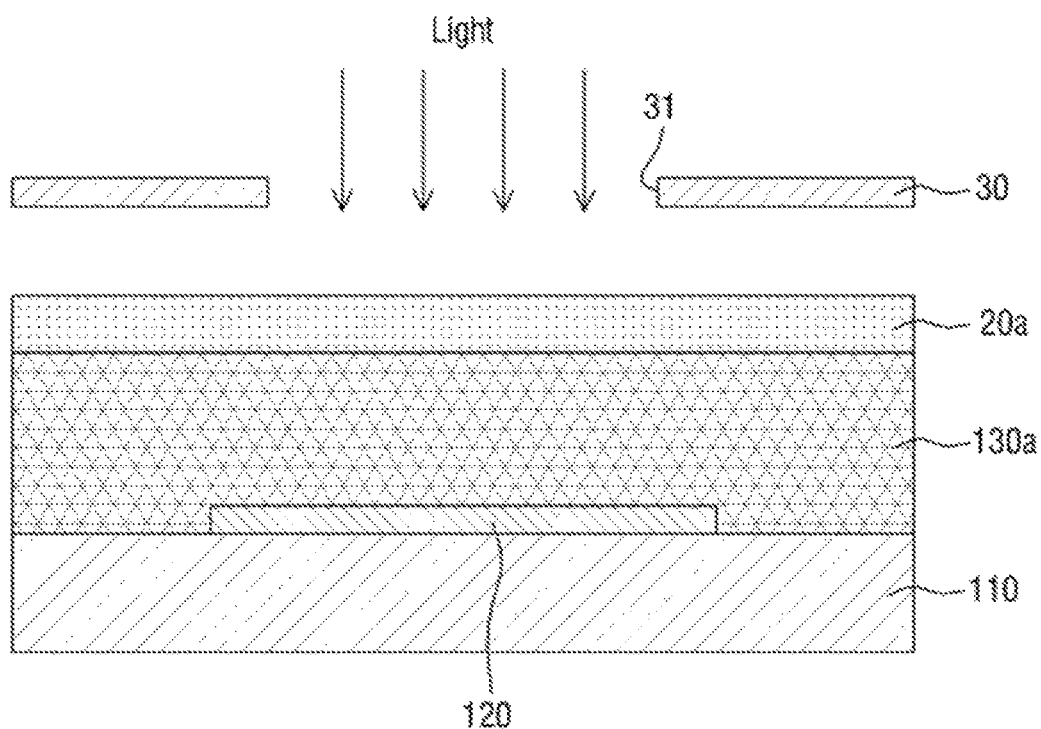
FIG. 15 illustrates an exposure process where a mask is used to pattern the photoresist film arranged on the first insulating material according to the second embodiment of the present invention.
Figure 16:
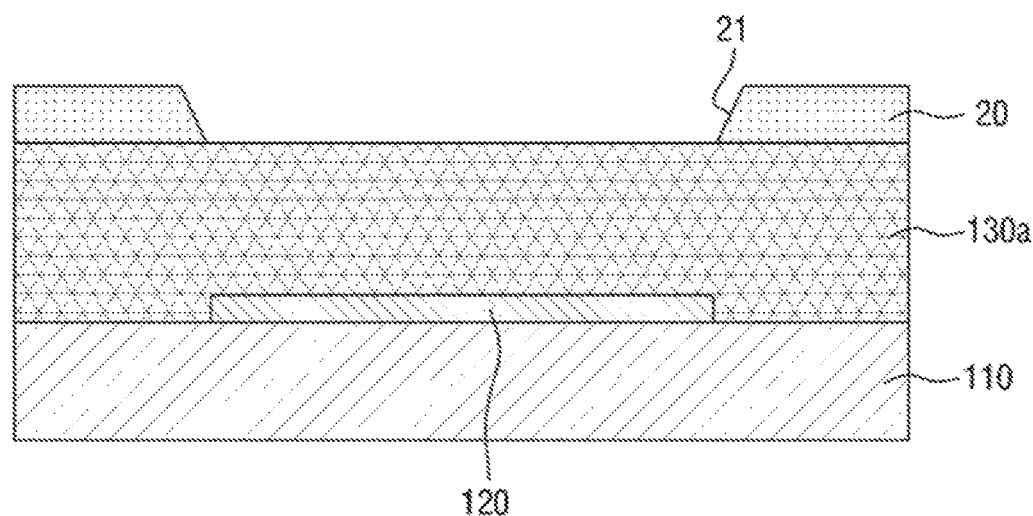
FIG. 16 illustrates a photoresist pattern after developing according to the second embodiment of the present invention.

Further, in the first and second insulating film forming step S20, as illustrated in FIG. 15, a first mask 30 having a first opening 31 is arranged on an upper portion of the photoresist film 20a, the first opening 30a being arranged at a location that corresponds to the first electrode 120, and the photoresist film 20a is exposed using light and is developed using a developer. As a result, as illustrated in FIG. 16, a photoresist pattern 20 having an opening 21 that is arranged to correspond to the first electrode 120 is formed.

Figure 17:
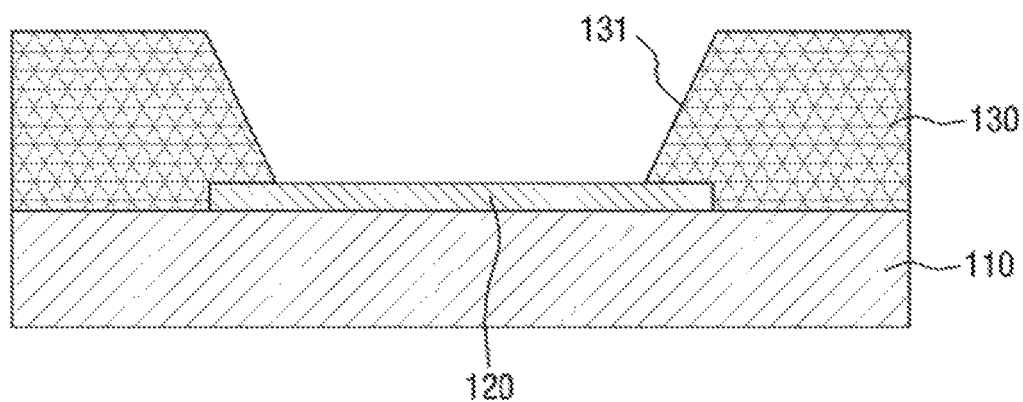
FIG. 17 illustrates a first opening arranged in a completed first insulating film after an etching process and a stripping process according to the second embodiment of the present invention.

Further, in the first and second insulating film forming step S20, the first insulating material 130a is etched using the photoresist pattern 20 as an etch mask, and as illustrated in FIG. 17, the first insulating film 130 is produced and has first opening 131 arranged at a location that corresponds to the first electrode 120. Thereafter, the photoresist pattern 20 is removed.

Figure 18:
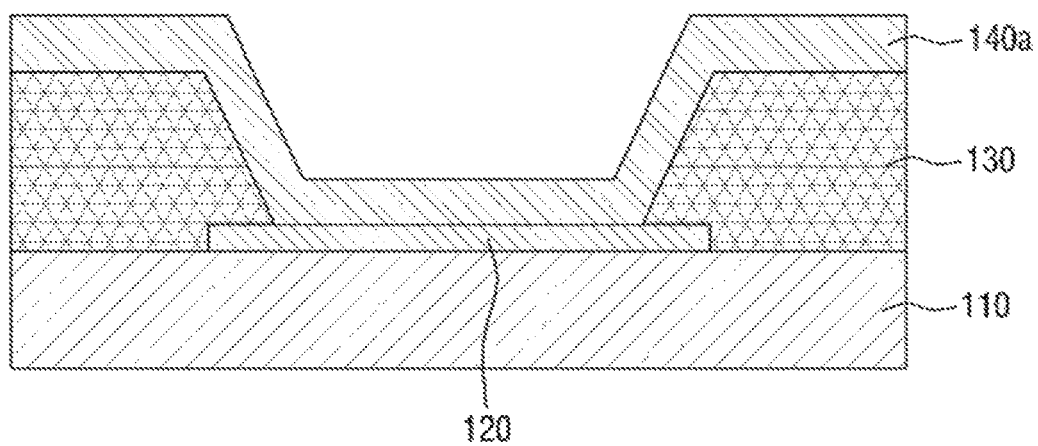
FIG. 18 illustrates application of a second insulating material that contains a photosensitive material onto the structure of FIG. 17 according to the second embodiment of the present invention.

Further, in the first and second insulating film forming step S20, as illustrated in FIG. 18, a second insulating material 140a is deposited on the first insulating film 130 and the first electrode 120 by a deposition technique. The second insulating material 140a is a material to form the second insulating film 140, and is the same as the insulating material of the second insulating film 140 as described above and may include a photosensitive material.

Figure 19:
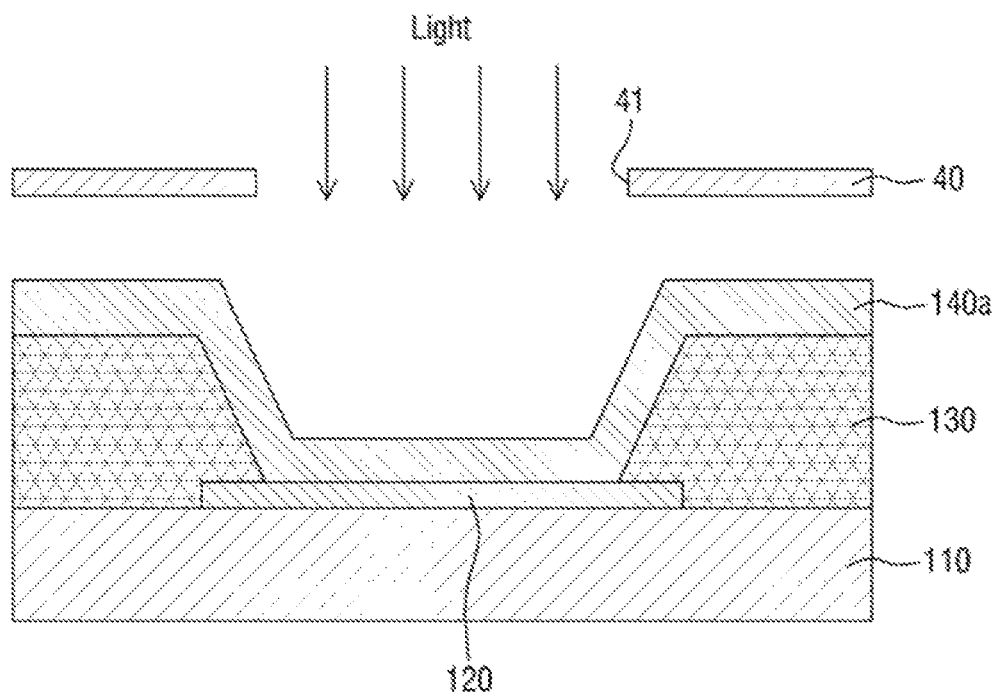
FIG. 19 illustrates an exposure process used to pattern the second insulating material where a second exposure mask is used according to the second embodiment of the present invention.
Figure 20:
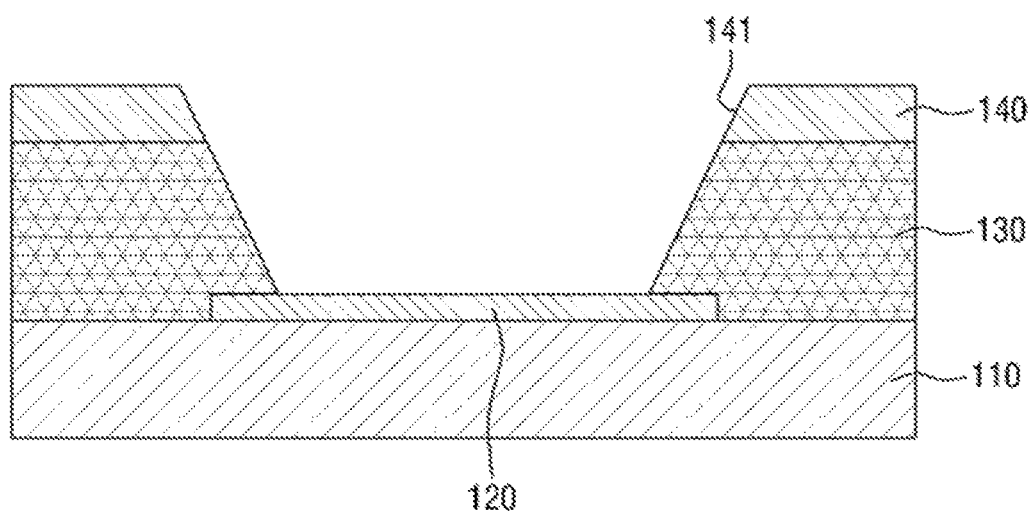
FIG. 20 illustrates a completed second insulating film having an opening after development according to the second embodiment of the present invention.

Further, in the first and second insulating film forming step S20, as illustrated in FIG. 19, a second mask 40 having a second opening 41 is arranged on an upper portion of the second insulating material 140a so that the second opening 41 is arranged at a location that corresponds to the first electrode 120, and the second insulating material 140a is exposed using light and is developed using a developer. As a result, as illustrated in FIG. 20, the second insulating film 140 having the second opening 141 that is arranged at a location that corresponds to the first electrode 120.

Figure 21:
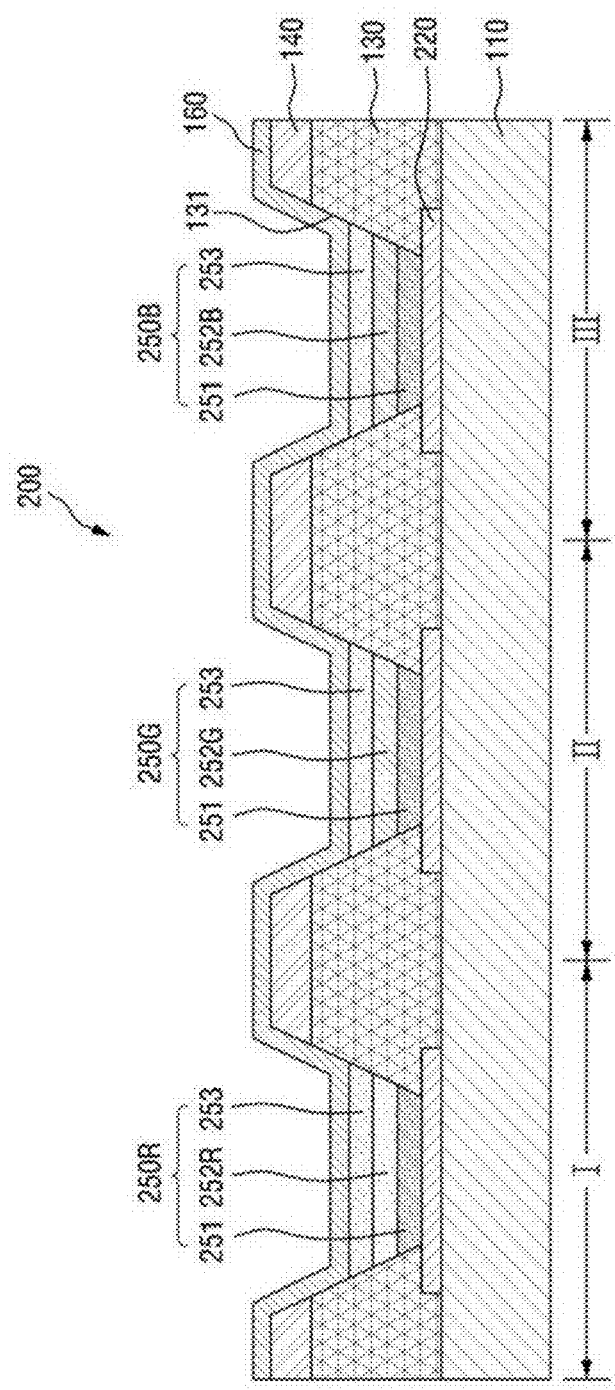
FIG. 21 is a cross-sectional view of a light emitting display device according to a second embodiment of the present invention.

Next, a light emitting display device according to a second embodiment of the present invention will now be described. Turning now to FIG. 21, FIG. 21 is a cross-sectional view of a light emitting display device according to a second embodiment of the present invention. Referring to FIG. 21, a light emitting display device 200 according to the second embodiment of the present invention includes a substrate 110, a first electrode 220, a first insulating film 130, a second insulating film 140, light emitting layers 250R, 250G, and 250B, and a second electrode 160. The light emitting display device 200 implements an organic light emitting display device that emits red, green, and blue lights through the light emitting layers 250R, 250G, and 250B respectively.

The first electrode 220 is similar to the first electrode 120 in FIG. 1. However, the first electrode 220 is formed for each pixel on the substrate 110. Here, the substrate 110 includes a plurality of pixels, and the plurality of pixels include a red pixel region I, a green pixel region II, and a blue pixel region III. The first electrode 220 is formed in each of the red pixel region I, the green pixel region II, and the blue pixel region III.

The light emitting layers 250R, 250G, and 250B are similar to the light emitting layer 150 illustrated in FIG. 1. However, the light emitting layers 250R, 250G, and 250B specifically include the red organic layer 250R, the green organic layer 250G, and the blue organic layer 250B.

The red organic layer 250R is formed on the first electrode 220 that is exposed through the opening of the first insulating film 130 in the red pixel region I. In the case where the first electrode 220 is an anode electrode and the second electrode 160 is a cathode electrode, the red organic layer 250R emits red light through recombination of holes provided from the first electrode 220 and electrons provided from the second electrode 160.

The red organic layer 250R may specifically include a hole injection layer 251, a red organic layer 252R, and an electron injection layer 253, which are sequentially laminated on the first electrode 220. The hole injection layer 251 serves to make the holes provided from the first electrode 220 be easily injected into the red organic layer 252R. The hole injection layer 251 may be made of organic compounds, for example, MTDATA(4,4',4"-tris(3-methylphenylphenylamino)triphenylamine), CuPc(copper phthalocyanine) or PEDOT/PSS(poly(3,4-ethylenedioxythiphene, polystyrene sulfonate)), but is not limited thereto.

The red organic layer 252R substantially emits red light through recombination of the holes provided from the first electrode 220 and the electrons provided from the second electrode 160. The red organic layer 252R may include one organic light emitting material, or may be formed to include a host and a dopant having a red color. Examples of the host may be $Alq_3$, CBP(4,4'-N,N'-dicarbazol-biphenyl), PVK (ploy(n-vinylcarbaxol)), ADN(9,10-Di(naphthyl-2-yl)anthrace), TCTA(4,4',4"-tris(N-carbazolyl)-triphenylamine), TPBI(1,3,5-tris(N-phenylbenzimidazol-2-yl)benzene), TBADN(3-tert-butyl-9,10-di(naphth-2-yl)anthracene), E3(terfluorene), and DSA(distyrylarylene), but are not limited thereto. On the other hand, as a red dopant, PtOEP, $Ir(piq)_3$, or $Btp_2Ir(acac)$ may be used, but is not limited thereto.

The electron injection layer 253 serves to make the electrons provided from the second electrode 160 be easily injected into the red organic layer 252R. Examples of the electron injection layer 253 may be LiF and CsF, but are not limited thereto.

Although not illustrated, the red organic layer 250R may further include a hole transport layer interposed between the hole injection layer 251 and the red organic layer 252R to perform smooth transportation of the holes, and an electron transport layer interposed between the electron injection layer 253 and the red organic layer 252R to perform smooth transportation of the electrons.

On the other hand, in the case where the first electrode 220 is a cathode electrode and the second electrode 160 is an anode electrode, the red organic layer 250R may include an electron injection layer, a red organic layer, and a hole injection layer, which are sequentially laminated on the first electrode 220. Even in this case, the red organic layer 250R may further include an electron transport layer formed between the electron injection layer and the red organic layer and a hole transport layer formed between the hole injection layer and the red organic layer.

The green organic layer 250G is formed on the first electrode 220 that is exposed through the opening of the first insulating film 130 in the green pixel region II. In the case where the first electrode 220 is an anode electrode and the second electrode 160 is a cathode electrode, the green organic layer 250G emits green light through recombination of holes provided from the first electrode 220 and electrons provided from the second electrode 160.

The green organic layer 250G may specifically include a hole injection layer 251, a green organic layer 252G, and an electron injection layer 252, which are sequentially laminated on the first electrode 220. The green organic layer 250G is different from the red layer 250R only on the point that it has the green organic layer 252G. Accordingly, as for the green organic layer 250G, only the green organic layer 252G will be described.

The green organic layer 252G substantially emits green light through recombination of the holes provided from the first electrode 220 and the electrons provided from the second electrode 160. The green organic layer 252G may include one organic light emitting material, or may be formed to include a host and a dopant having a green color. Examples of the host may be $Alq_3$, CBP(4,4'-N,N'-dicarbazol-biphenyl), PVK(ploy(n-vinylcarbaxol)), ADN(9,10-Di (naphthyl-2-yl)anthrace), TCTA(4,4',4"-tris(N-carbazolyl)-triphenylamine), TPBI(1,3,5-tris(N-phenylbenzimidazol-2-yl)benzene), TBADN(3-tert-butyl-9,10-di(naphth-2-yl) anthracene), E3(terfluorene), and DSA(distyrylarylene), but are not limited thereto. On the other hand, as a green dopant, Ir(ppy)$_3$, Ir(ppy)$_2$(acac), or Ir(mpyp)$_3$ may be used, but is not limited thereto.

The blue organic layer 250B is formed on the first electrode 220 that is exposed through the opening of the first insulating film 130 in the blue pixel region III. In the case where the first electrode 220 is an anode electrode and the second electrode 160 is a cathode electrode, the blue organic layer 250B emits blue light through recombination of holes provided from the first electrode 220 and electrons provided from the second electrode 160.

The blue organic layer 250B may specifically include a hole injection layer 251, a blue organic layer 252B, and an electron injection layer 253, which are sequentially laminated on the first electrode 220. The blue organic layer 250B is different from the red organic layer 250R only on the point that it has the blue organic layer 252B. Accordingly, as for the blue organic layer 250B, only the blue organic layer 252B will be described.

The blue organic layer 252B substantially emits blue light through recombination of the holes provided from the first electrode 220 and the electrons provided from the second electrode 160. The blue organic layer 252B may include one organic light emitting material, or may be formed to include a host and a dopant having a blue color. Examples of the host may be Alq$_3$, CBP(4,4'-N,N'-dicarbazol-biphenyl), PVK (ploy(n-vinylcarbaxol)), ADN(9,10-Di(naphthyl-2-yl)anthrace), TCTA(4,4',4"-tris(N-carbazolyl)-triphenylamine), TPBI(1,3,5-tris(N-phenylbenzimidazol-2-yl)benzene), TBADN(3-tert-butyl-9,10-di(naphth-2-yl)anthracene), E3(terfluorene), and DSA(distyrylarylene), but are not limited thereto. On the other hand, as a blue dopant, F$_2$Irpic, (F$_2$ppy)$_2$Ir(tmd), Ir(dfppz)$_3$, ter-fluorene, DPAVBi(4,4'-bis (4-diphenylaminostyryl) biphenyl), or TBPe(2,5,8,11-tetra-ti-butyl pherylene) may be used, but is not limited thereto.

On the other hand, in FIG. 21, the first insulating film 130 may serve as a pixel-defining film that defines a pixel, and also serve to form the light emitting layers 250R, 250G, and 250B with a uniform thickness on both regions of the first electrode 220 and the first insulating film 130 when the light emitting layers 250R, 250G, and 250B are formed by printing the light emitting material of the light emitting layers 250R, 250G, and 250B on the first electrode 220 that is exposed through the first opening 131 of the first insulating film 130 by the ink jet printing technique.

Further, in FIG. 21, the second insulating film 140 may serve as a barrier that prevents the light emitting material from escaping from the first opening 131 of the first insulating film 130 when the light emitting material of the light emitting layers 250R, 250G, and 250B is printed on the first electrode 220 that is exposed through the first opening 131 of the first insulting film 130 by the ink jet printing technique. Further, in the case where the second insulating film 140 includes a photosensitive material, it may serve as a mask film when the first insulating film 130 having the first opening 131 is formed by the photolithography process.

Although not illustrated, the light emitting display device 200 may further include a sealing substrate that is arranged on an upper portion of the second electrode 160. The sealing substrate may be an insulating substrate. A spacer may be disposed between the second electrode 160 on the second insulating film 140 and the sealing substrate. In some embodiments of the present invention, the sealing substrate may be omitted. In this case, a sealing film that is made out of an insulating material may cover the whole structure to protect the structure.

As described above, the light emitting display device 200 according to the second embodiment of the present invention includes the light emitting layers 250R, 250G, and 250B to implement an organic light emitting display device, and includes the first insulating film 130 and the second insulating film 140, which are made out of different insulating materials, respectively, so that the difference in wetting between the first electrode 220 and the first insulting film 130 with respect to the light emitting material becomes lower than the difference in wetting between the second insulating film 140 and the first electrode 220 with respect to the light emitting material.

According to the light emitting display device 200 according to other embodiment of the present invention, when the light emitting layers 250R, 250G, and 250B are formed by printing the light emitting material of the light emitting layers 250R, 250G, and 250B on the first electrode 220 that is exposed through the first opening 131 of the first insulating film 130 by the ink jet printing process, the light emitting material of the light emitting layers 250R, 250G, and 250B is prevented from getting out of the first opening 131 of the first insulating film 130, and the light emitting layers 250R, 250G, and 250B are formed with a uniform thickness on both the first electrode 220 and the first insulating film 130.

Accordingly, since the light emitting layers 250R, 250G, and 250B are accurately positioned in the desired space and are formed with the uniform thickness, uniform light emission through the light emitting layers 250R, 250G, and 250B can be performed, and thus the display quality of the light emitting display device 200 can be improved.

On the other hand, the same steps as the methods for fabricating the light emitting display device 100 according to an FIGS. 5 to 20 of the present invention are applied to the method for fabricating the light emitting display device 200 according to other embodiment of the present invention. However, according to the method for fabricating the light emitting display device 200 according to the second embodiment of the present invention, in the first electrode forming step S10, the first electrode 220 is arranged in the red pixel region I, the green pixel region II, and the blue pixel region III by pixels on the substrate 110.

Further, the light emitting layer forming step S30 includes forming the red organic light emitting layer 250R on the first electrode 220 that is exposed through the first opening 131 of the first insulating film 130 in the red pixel region I, forming the green organic light emitting layer 250G on the first electrode 220 that is exposed through the first opening 131 of the first insulating film 130 in the green pixel region II, and forming the blue organic light emitting layer 250B on the first electrode 220 that is exposed through the first opening 131 of the first insulating film 130 in the blue pixel region III.

Figure 22:
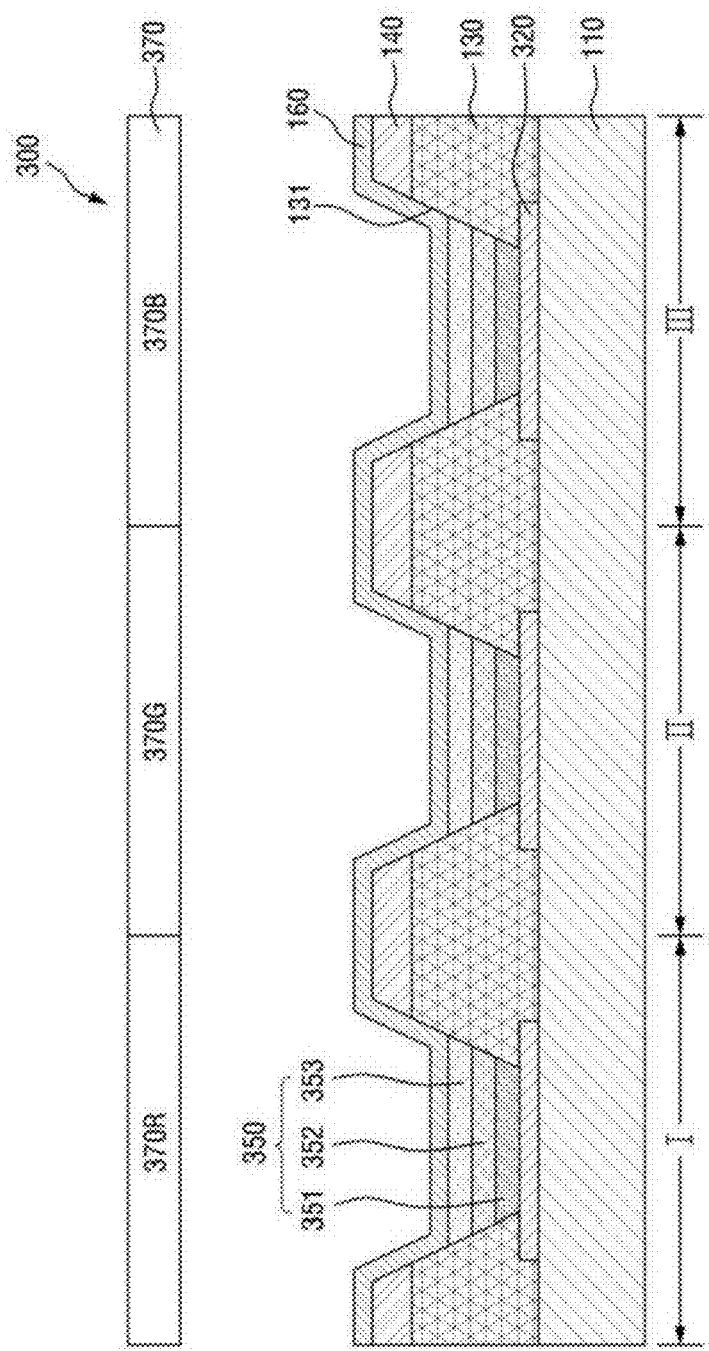
FIG. 22 is a cross-sectional view of a light emitting display device according to a third embodiment of the present invention.
Figure 23:
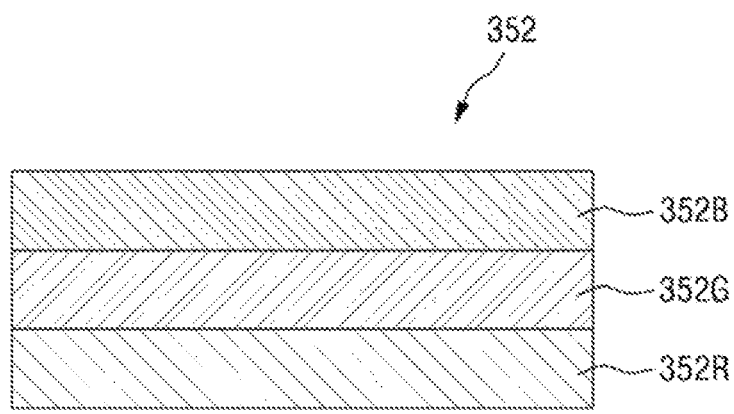
FIG. 23 is a cross-sectional view illustrating one structure of a white organic light emitting layer in the light emitting display device of FIG. 22.
Figure 24:
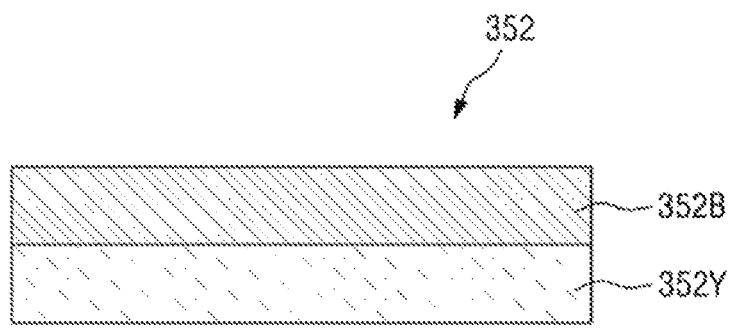
FIG. 24 is a cross-sectional view illustrating another structure of a white organic light emitting layer in the light emitting display device of FIG. 22.

Next, a light emitting display device according to a third embodiment of the present invention will be described. Turning now to FIGS. 22 to 24, FIG. 22 is a cross-sectional view of a light emitting display device according to a third embodiment of the present invention, FIG. 23 is a cross-sectional view illustrating one structure of a white organic light emitting layer in the light emitting display device of FIG. 22, and FIG. 24 is a cross-sectional view illustrating another structure of a white organic light emitting layer in the light emitting display device of FIG. 22.

Referring now to FIG. 22, a light emitting display device 300 according to the third embodiment of the present invention includes a substrate 110, a first electrode 320, a first insulating film 130, a second insulating film 140, a light emitting layer 350, a second electrode 160, and a color filter 370. The light emitting display device 300 implements an organic light emitting display device that emits white light through the light emitting layer 350.

The first electrode 320 is similar to the first electrode 120 in FIG. 1, however the first electrode 320 is specifically formed for each pixel on the substrate 110. Here, the substrate 110 includes a plurality of pixels, and the plurality of pixels include a red pixel region I, a green pixel region II, and a blue pixel region III. The first electrode 320 is formed in the red pixel region I, the green pixel region II, and the blue pixel region III. The light emitting layer 350 is similar to the light emitting layer 150 illustrated in FIG. 1, however the light emitting layer 350 specifically emits white light.

The light emitting layer 350 is formed on the first electrode 320 that is exposed through the first opening 131 of the first insulating film 130 in the red pixel region I, the green pixel region II, and the blue pixel region III. In the case where the first electrode 320 is an anode electrode and the second electrode 160 is a cathode electrode, the light emitting layer 350 emits the white light through recombination of holes provided from the first electrode 320 and electrons provided from the second electrode 160.

Specifically, the light emitting layer 350 may include a hole injection layer 351, a white organic layer 352, and an electron injection layer 353, which are sequentially laminated on the first electrode 320. Since the hole injection layer 351 and the electron injection layer 353 are the same as the hole injection layer 251 and the electron injection layer 252 of FIG. 21, the duplicate description thereof will be omitted.

The while organic layer 352 specifically emits the white light through recombination of the holes provided from the first electrode 320 and the electrons provided from the second electrode 160.

The white organic layer 352 may be specifically configured by laminating a red organic layer 352R that emits red light, a green organic layer 352G that emits green light, and a blue organic layer 352B that emits blue light as illustrated in FIG. 23. The white organic layer 352 emits the white light in which the red light, the green light, and the blue light are mixed. On the other hand, in FIG. 23, it is exemplified that the green organic layer 352G is laminated on the red organic layer 352R, and the blue organic layer 352B is laminated on the green organic layer 352G. However, the present invention is not limited to any such a lamination order. Since the configuration of the red organic layer 352R, the green organic layer 352G, and the blue organic layer 352B may be the same as the configuration of the red organic layer 252R, the green organic layer 252G, and the blue organic layer 252B, the duplicate description thereof will be omitted.

Further, the white organic layer 352 may be specifically configured by laminating a yellow organic layer 352Y that emits yellow light and the blue organic layer 352B that emits blue light as illustrated in FIG. 24. This white organic layer 352 emits the white light in which the yellow light and the blue light are mixed.

A color filter 370 is arranged on an upper portion of the second electrode 160, and includes a red color filter 370R arranged in the red pixel region I, a green color filter 370G arranged in the green pixel region II, and a blue color filter 370B arranged in the blue pixel region III. The color filter 370 may emit red, green and blue color lights by filtering the white light emitted from the light emitting layer 350.

In FIG. 22, a top emission type organic light emitting display device is exemplified, however in the case of a bottom emission type organic light emitting display device, the color filter may be installed on the bottom surface of the substrate. As another example, the color filter may be provided in the device in the form of an organic film as in a COA (Color Filter on Array) structure.

On the other hand, in FIG. 22, the first insulating film 130 may serve as a pixel-defining film that defines the pixel, and also serve to form the light emitting layer 350 with a uniform thickness on both regions of the first electrode 320 and the first insulating film 130 when the light emitting layer 350 is formed by printing the light emitting material by an ink jet printing technique.

Further, in FIG. 22, the second insulating film 140 may serve as a barrier that prevents the light emitting material from escaping out of the first opening 131 of the first insulating film 130 when the light emitting material of the light emitting layer 350 is printed by the ink jet printing technique. Further, in the case where the second insulating film 140 includes a photosensitive material, the second insulating film 140 may serve as an etch mask for patterning the first insulating film 130 to produce the first opening 131.

Although not illustrated, the light emitting display device 300 may further include a sealing substrate that is arranged on an upper portion of the second electrode 160. The sealing substrate may be an insulating substrate. A spacer may be disposed between the second electrode 160 on the second insulating film 140 and the sealing substrate. In some embodiments of the present invention, the sealing substrate may be omitted. In this case, a sealing film that is made out of an insulating material may cover the whole structure to protect the structure.

As described above, the light emitting display device 300 according to the third embodiment of the present invention includes the light emitting layer 350 that produces white light, and includes the first insulating film 130 and the second insulating film 140, which are made out of different insulating materials, respectively, so that the difference in wetting between the first electrode 320 and the first insulting film 130 with respect to the light emitting material becomes lower than the difference in wetting between the second insulating film 140 and the first electrode 320 with respect to the light emitting material.

According to the light emitting display device 300 according to the third embodiment of the present invention, when the light emitting layer 350 is produced by printing by an ink jet technique the light emitting material of the light emitting layer 350 on the first electrode 320 that is exposed through the first opening 131 of the first insulating film 130, the light emitting material of the light emitting layer 350 is prevented from escaping out of the first opening 131 of the first insulating film 130, and the light emitting layer 350 is formed with a uniform thickness on both the first electrode 320 and the first insulating film 130. Accordingly, since the light emitting layer 350 is positioned in the desired space and is formed with the uniform thickness, uniform light emission through the light emitting layer 350 can be achieved, and thus the display quality of the light emitting display device 300 can be improved.

On the other hand, the same steps as the method for fabricating the light emitting display device 100 according to the methods of FIGS. 5 to 20 can also be applied to the method for fabricating the light emitting display device 300 according to the third embodiment of the present invention. However, according to the method for fabricating the light emitting display device 300 according to the third embodiment of the present invention, in the first electrode forming step S10, the first electrode 320 is arranged on the red pixel region I, the green pixel region II, and the blue pixel region III by pixels on the substrate 110. Further, in the light emitting layer forming step S30, the light emitting layer 350 including the white organic layer 352 that emits white light, and is formed on the first electrode 320 that is exposed through the opening 131 of the first insulating film 130 in each of the red pixel region I, the green pixel region II, and the blue pixel region III.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A light emitting display device, comprising:
   a substrate;
   a first electrode arranged on the substrate;
   a first insulating film arranged on the substrate and including a first opening that exposes a portion of the first electrode;
   a second insulating film arranged on the first insulating film and including a second opening that exposes the first opening;
   a light emitting layer including a light emitting material, wherein the light emitting layer is arranged on the portion of first electrode that is exposed by the first opening while also being in contact with the first insulating film, and the light emitting layer is completely spaced-apart from the second insulating film; and
   a second electrode arranged on the light emitting layer, wherein a difference in wetting between the first electrode and the first insulating film with respect to the light emitting material is lower than a difference in wetting between the first electrode and the second insulating film with respect to the light emitting material.

2. The light emitting display device of claim 1, wherein the wetting of the first insulating film with respect to the light emitting material is substantially the same as the wetting of the first electrode with respect to the light emitting material.

3. The light emitting display device of claim 1, wherein contact angles of the first electrode and the first insulating film with respect to the light emitting material are equal to or lower than 10°, and a contact angle of the second insulating film with respect to the light emitting material is equal to or greater than 50°.

4. The light emitting display device of claim 1, wherein the first electrode is comprised of ITO (Indium Tin Oxide), and the first insulating film is comprised of a material selected from a group consisting of silicon oxide, silicon nitride and silicon oxynitride.

5. The light emitting display device of claim 1, wherein the first insulating film is comprised of a material selected from a group consisting of silicon oxide, silicon nitride, and silicon oxynitride, and the second insulating film is comprised of a material selected from a group consisting of benzo cyclo butene (BCB), polyimide (PI), polyamide (PA), acrylic resin and phenol resin.

6. The light emitting display device of claim 1, wherein the light emitting layer is comprised of a material selected from a group consisting of an inorganic material including Se, inorganic material including Zn, a low-molecular organic material and a high-molecular organic material.

7. The light emitting display device of claim 1, wherein the second insulating film comprises a photosensitive material.

8. The light emitting display device of claim 1, wherein the substrate includes a plurality of pixels, and the first insulating film is a pixel-defining film that defines each of the plurality of pixels.

9. The light emitting display device of claim 8, wherein the plurality of pixels comprises a red pixel region, a green pixel region, and a blue pixel region, the light emitting layer comprises:
   a red organic light emitting layer arranged within the red pixel region;
   a green organic light emitting layer arranged within the green pixel region; and
   a blue organic light emitting layer arranged within the blue pixel region.

10. The light emitting display device of claim 8, wherein the light emitting layer comprises a white organic layer.

11. The light emitting display device of claim 1, wherein the light emitting layer directly contacts the first insulating film.

12. The light emitting display device of claim 10, wherein the light emitting layer has a single upper major surface that is everywhere parallel to an upper surface of the substrate.

13. The light emitting display device of claim 1, the light emitting layer being arranged only at locations that the second insulating layer is absent.

14. The light emitting display device of claim 1, the first insulating film being comprised only of an inorganic insulator selected from a group consisting of silicon oxide, silicon nitride, and silicon oxynitride, the second insulating film being comprised only of an organic insulator selected from a group consisting of benzo cyclo butene (BCB), polyimide (PI), polyamide (PA), acrylic resin and phenol resin.

15. The light emitting display device of claim 1, the light emitting display device being produced by a process comprising:
   forming the first electrode on the substrate;
   forming the first and the second insulating films on the substrate;
   forming the light emitting layer on the exposed portion of the first electrode while directly contacting the first insulating film, the light emitting layer being produced by an ink jet printing process whereby a liquid light emitting material is discharged from an ink jet print head onto the exposed portion of the first electrode; and
   forming the second electrode on the light emitting layer, the second insulating film to serve as a barrier to contain the light emitting material within the first opening and not the second opening while preventing the light emitting material from directly contacting the second insulating film.

* * * * *